United States Patent
Zhang et al.

(10) Patent No.: US 10,551,652 B2
(45) Date of Patent: Feb. 4, 2020

(54) DISPLAY PANEL, DISPLAY DEVICE AND METHOD FOR PACKAGING DISPLAY PANEL

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Liang Zhang, Beijing (CN); Fuyi Cui, Beijing (CN); Shanshan Bao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/737,530

(22) PCT Filed: Jun. 21, 2017

(86) PCT No.: PCT/CN2017/089303
§ 371 (c)(1),
(2) Date: Dec. 18, 2017

(87) PCT Pub. No.: WO2018/014694
PCT Pub. Date: Jan. 25, 2018

(65) Prior Publication Data
US 2019/0129228 A1    May 2, 2019

(30) Foreign Application Priority Data
Jul. 22, 2016  (CN) .......................... 2016 1 0586440

(51) Int. Cl.
*G02F 1/1333* (2006.01)
*H01L 51/52* (2006.01)

(52) U.S. Cl.
CPC .... *G02F 1/133308* (2013.01); *H01L 51/5246* (2013.01); *G02F 2202/28* (2013.01)

(58) Field of Classification Search
None
See application file for complete search history.

(56) References Cited

U.S. PATENT DOCUMENTS

2006/0082298 A1   4/2006  Becken et al.
2009/0308105 A1  12/2009  Pastel et al.
(Continued)

FOREIGN PATENT DOCUMENTS

CN    101095247 A    12/2007
CN    102089898 A     6/2011
(Continued)

OTHER PUBLICATIONS

First Office Action for Chinese Application No. 201610586440.9, dated Jun. 2, 2017, 7 Pages.
(Continued)

*Primary Examiner* — Ashok Patel
(74) *Attorney, Agent, or Firm* — Brooks Kushman P.C.

(57) ABSTRACT

The present disclosure relates to a display panel, a display device and a method for packaging a display panel. The display panel includes a substrate and a cover plate, wherein the substrate includes a display region and a packaging region located at a periphery of the display region, a glass adhesive is arranged between the substrate and the cover plate at a position corresponding to the packaging region, and a functional layer is arranged on the cover plate at a (Continued)

position corresponding to the glass adhesive, for reducing an intensity of laser irradiated on the glass adhesive during the sintering.

20 Claims, 2 Drawing Sheets

(56) References Cited

U.S. PATENT DOCUMENTS

2011/0241528 A1* 10/2011 Choi ................ H01L 51/524
                                                             313/317
2017/0069870 A1    3/2017  Wang et al.

FOREIGN PATENT DOCUMENTS

| CN | 103943648 A | 7/2014 |
| CN | 104867960 A | 8/2015 |
| CN | 105977399 A | 9/2016 |

OTHER PUBLICATIONS

Second Office Action for Chinese Application No. 201610586440.9, dated Sep. 25, 2017, 6 Pages.
International Search Report and Written Opinion for Application No. PCT/CN2017/089303, dated Sep. 30, 2017, 9 Pages.

* cited by examiner

DISPLAY PANEL, DISPLAY DEVICE AND METHOD FOR PACKAGING DISPLAY PANEL

CROSS-REFERENCE TO RELATED APPLICATIONS

This application is the U.S. national phase of PCT Application No. PCT/CN2017/089303 filed on Jun. 21, 2017, which claims priority to Chinese Patent Application No. 201610586440.9 filed on Jul. 22, 2016, which are incorporated herein by reference in their entireties.

TECHNICAL FIELD

The present disclosure relates to the field of manufacturing technology of a liquid crystal product, and in particular, to a display panel, a display device and a method for packaging a display panel.

BACKGROUND

Currently, a photovoltaic device, a plasma display, an organic light emitting diode, an AMOLED (Active Matrix/Organic Light Emitting Diode), or the like, need to be sealed by using a glass adhesive. In a packaging process, in the case that the glass adhesive is sintered by a laser beam irradiated thereon, due to a non-uniform distribution of energy received by the glass adhesive, a packaging performance of the glass adhesive is reduced. For example, in a related art, the glass adhesive is sintered using a laser for outputting a laser beam focused into a circular spot. A width of the glass adhesive may be slightly less than a diameter of a laser spot. Since a position closer to a center of the glass adhesive is scanned by the laser spot for a longer time than a position of an edge of the glass adhesive, a heat quantity received in a central region of the glass adhesive is greater than that received in an edge region. In this way, the glass adhesive at the edge region cannot effectively melt for bonding, or the glass adhesive is over sintered due to excessive energy at the center region of the glass adhesive, and the packaging performance of the glass adhesive is decreased. In addition, since the energy at the center region is higher than that at the edge region, a non-uniform stress distribution is generated due to a non-uniform heat distribution inside the glass adhesive, thereby causing a reduction in mechanical strength of an OLED (Organic Light Emitting Display) device.

SUMMARY

The present disclosure provides a display panel, a display device and a method for packaging a display panel, so as to improve the packaging performance of the glass adhesive.

An embodiment of the present disclosure provides a display panel, including a substrate and a cover plate, wherein the substrate includes a display region and a packaging region located at a periphery of the display region, a glass adhesive is arranged between the substrate and the cover plate at a position corresponding to the packaging region, and a functional layer is arranged on the cover plate at a position corresponding to the glass adhesive, and configured to reduce an intensity of a laser beam irradiated on the glass adhesive during a sintering process.

Optionally, the glass adhesive includes a central region and an edge region, and the functional layer is further configured to reduce the intensity of the laser beam irradiated on the central region during the sintering process, such that a difference value between the intensity of the laser beam irradiated on the central region and that irradiated on the edge region is not greater than an intensity threshold value.

Optionally, the functional layer includes a first region corresponding to the central region and a second region corresponding to the edge region, and a thickness of the first region is greater than that of the second region.

Optionally, a difference value between the thickness of the first region and that of the second region is set to be a first selected value, such that the intensity of the laser beam irradiated on the central region of the glass adhesive is the same as that irradiated on the edge region of the glass adhesive.

Optionally, a difference value between the thickness of the first region and that of the second region is set to be a second selected value, such that the intensity of the laser beam irradiated on the central region of the glass adhesive is less than that irradiated on the edge region of the glass adhesive.

Optionally, the thickness of the functional layer in a transition region decreases gradually from the first region to the second region, such that the glass adhesive has a uniform intensity of the laser beam irradiated thereon.

Optionally, the functional layer is arranged on a side of the cover plate away from the substrate.

Optionally, the functional layer is arranged on a side of the cover plate close to the substrate.

Optionally, an area of the functional layer is not less than that of the glass adhesive.

Optionally, the functional layer is arranged at one side of the cover plate away from the substrate.

Optionally, the functional layer is arranged at one side of the cover plate close to the substrate.

Optionally, an area of the functional layer is not less than that of the glass adhesive.

Optionally, the functional layer is formed by a plurality of stacked film layers. Further, at least two film layers of the functional layer are made of different materials.

Optionally, the functional layer is made of a transparent or semi-transparent material.

Optionally, the functional layer is made of indium tin oxide (ITO), and has a thickness greater than 500 Å.

Optionally, the thickness of the functional layer decreases gradually from the center to the periphery.

Optionally, the thickness of the functional layer corresponds to the distribution of the intensity of the laser beam output by a laser used in the sintering process, wherein the thickness of the functional layer in a region corresponding to the laser beam output by the laser with a high intensity has a thickness greater than that of the functional layer in a region corresponding to the laser beam output by the laser with a low intensity.

The present disclosure further provides a display device, including any one of the above-mentioned display panels.

The present disclosure further provides a method for packaging a display panel, wherein the display panel includes a substrate and a cover plate, the substrate includes a display region and a packaging region at the periphery of the display region, and the method includes: arranging a glass adhesive between the substrate and the cover plate at a position corresponding to the packaging region; forming a functional layer on the cover plate at a position corresponding to the glass adhesive, wherein the functional layer is configured to reduce an intensity of a laser beam irradiated on the glass adhesive during a sintering process; and sintering the glass adhesive by a laser beam irradiated thereon through the functional layer.

Optionally, the forming a functional layer on the cover plate at a position corresponding to the glass adhesive includes: forming the functional layer at the position corresponding to the glass adhesive and on a side of the cover plate away from the substrate; and the sintering the glass adhesive by a laser beam irradiated thereon includes: sintering the glass adhesive by the laser beam irradiated thereon from a side of the functional layer away from the cover plate.

Optionally, the glass adhesive includes a central region and an edge region, and the functional layer is further configured to reduce the intensity of the laser beam irradiated on the central region during the sintering process;

Optionally, this method further includes: removing the functional layer.

DETAILED DESCRIPTION

The features and theories of the present disclosure will be explained in detail below in combination with drawings, and the embodiments herein are merely for explaining the present disclosure, instead of limiting the protection scope of the present disclosure.

Figure 1:
FIG. 1 shows a structural schematic diagram of a display panel according to some embodiments of the present disclosure.
Figure 2:
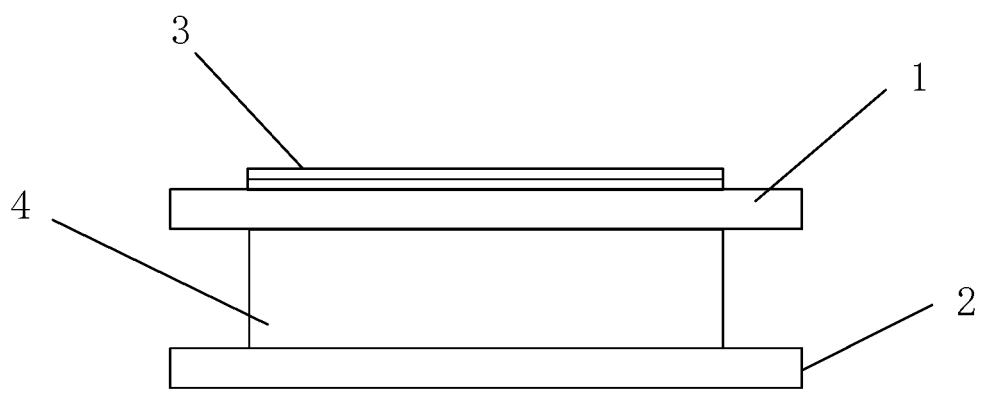
FIG. 2 shows a structural schematic diagram of a display panel according to some embodiments of the present disclosure.

As shown in FIGS. 1 and 2, some embodiment of the present disclosure provides a display panel, including a substrate 2 and a cover plate 1, wherein the substrate 2 includes a display region and a packaging region located at a periphery of the display region, a glass adhesive 4 is arranged between the substrate 2 and the cover plate 1 at a position corresponding to the packaging region, and a functional layer 3 is arranged on the cover plate 1 at a position corresponding to the glass adhesive 4, and configured to reduce an intensity of a laser beam irradiated on the glass adhesive during a sintering process. Further, with the functional layer 3, a difference between a maximum value and a minimum value of an intensity of the laser beam irradiated on the glass adhesive is not greater than an intensity threshold value. This intensity threshold value may be set as needed.

In the case that the functional layer is not provided, the intensity of the laser beam irradiated on the certain region of the glass adhesive are relatively large. With the above-mentioned embodiment, the intensity of the laser beam irradiated on these regions is reduced by the functional layer. Accordingly, over sintering on the glass adhesive or poor bonding due to poor melting of the glass adhesive can be effectively avoided, and the packaging performance of the glass adhesive is improved. Since the difference between the maximum value and the minimum value of the intensity of the laser beam irradiated on the glass adhesive is not greater than the intensity threshold, the glass adhesive may be substantially heated uniformly thereinside, and a robustness of the display device is improved.

Optionally, the glass adhesive 4 includes a central region and an edge region, and the functional layer 3 is further configured to reduce the intensity of the laser beam irradiated on the central region during the sintering process, such that a difference value between the intensity of the laser beam irradiated on the central region and that irradiated on the edge region is not greater than an intensity threshold value. In the case that the functional layer is not arranged, during the sintering process (for example, the glass adhesive is sintered by a laser for outputting a laser beam on the glass adhesive as a round or an oval spot), the intensity of the laser beam irradiated on the central region is greater than that irradiated on the edge region. It should be understood that the central region of the glass adhesive may be round, oval, or rectangular, or have other irregular shapes. The edge region of the glass adhesive may refer to a region other than the central region, or a transition region exists between the central region and the edge region of the glass adhesive, which is not limited in the present disclosure.

The arrangement of the functional layer 3 may reduce the intensity of the laser beam irradiated on the central region of the glass adhesive 4 during the laser sintering process, that is, a part of the laser energy is blocked, thereby further reducing the difference value between the heat received at the central region of the glass adhesive 4 and that received at the edge region, avoiding poor bonding due to poor melting of the edge region of the glass adhesive 4, and improving the packaging performance of the glass adhesive 4.

Moreover, the arrangement of the functional layer 3 effectively alleviates a non-uniform stress distribution caused by the non-uniform heat distribution inside the glass adhesive 4 due to the energy at the central region of the glass adhesive 4 higher than that at the edge of the glass adhesive 4 during the laser sintering process, thereby improving the mechanical strength of the OLED device.

Meanwhile, the arrangement of the functional layer 3 avoids the adverse effects caused by the over sintering of the glass adhesive 4 due to the excessive energy at the central region of the glass adhesive 4 during the laser sintering process, and improves the packaging effect.

In the present embodiment, the functional layer 3 may be arranged on a side of the cover plate 1 away from the substrate 2 as needed, as shown in FIG. 1; or the functional layer 3 is arranged on a side of the cover plate 1 close to the substrate 2, as shown in FIG. 2.

In order to reduce the energy at the central region of the glass adhesive 4 during the laser sintering process, the functional layer 3 may be arranged corresponding to the central region of the glass adhesive 4. In some embodiment, the area of the functional layer 3 corresponds to that of the central region of the glass adhesive 4. However, such an arrangement may increase the difficulty of manufacturing the functional layer 3. In the present embodiment, an area size of the functional layer 3 is not limited, as long as the intensity of the laser beam irradiated on the central region of the glass adhesive can be reduced during the laser sintering process, and the adverse effects caused by the over sintering of the glass adhesive can be avoided. In the present embodiment, in order to ensure that the functional layer 3 is capable of effectively adjusting the uniformity of the intensity of the laser beam irradiated on glass adhesive 4, that is to effectively reduce the difference value between the heat received at the central region of the glass adhesive 4 and that received at the edge region of the glass adhesive 4, preferably, the area of the functional layer 3 is not less than that of the glass adhesive 4.

For the sake of convenience in manufacturing the functional layer 3, the functional layer 3 may be covered on the entire cover plate 1. It should be noted that the material, the thickness, or the like, of the functional layer 3, do not influence the performance of the display panel.

Optionally, the functional layer 3 may have a plurality of structural forms.

Optionally, the configuration (such as thickness) of the functional layer corresponds to the distribution of the intensity of the laser beam output by the laser used in the sintering process, wherein the thickness of the functional layer in a region corresponding to the laser beam output by the laser with a high intensity has a thickness greater than that of the functional layer in a region corresponding to the laser beam output by the laser with a low intensity.

Optionally, the thickness of the functional layer may also decrease gradually from the center to the periphery.

Optionally, the area of the functional layer may be less than that of the glass adhesive. For example, the functional layer corresponds to the central region of the glass adhesive 4. Optionally, in the laser sintering process, in order to reduce the energy of the central region of the glass adhesive 4 and to improve the packaging performance of the display panel, the thickness of a first region included in the functional layer 3 may be greater than that of a second region included in the functional layer 3, wherein the first region corresponds to the central region of the glass adhesive 4, and the second region corresponds to the edge region of the glass adhesive 4.

By setting different thicknesses of the first region and the second region on the function layer 3, the intensity of the laser beam irradiated on the central region of the glass adhesive 4 is reduced during the sintering process, that is, the difference value between the heat received at the central region of the glass adhesive 4 and that received at the edge region is reduced. Accordingly, the over sintering of the central region of the glass adhesive 4 is avoided, and the edge of the glass adhesive 4 is effectively sintered.

Further, a difference value between the thickness of the first region and that of the second region is set to be a first selected value, such that the intensity of the laser beam irradiated on the central region of the glass adhesive is the same as that irradiated on the edge region of the glass adhesive.

Figure 3:
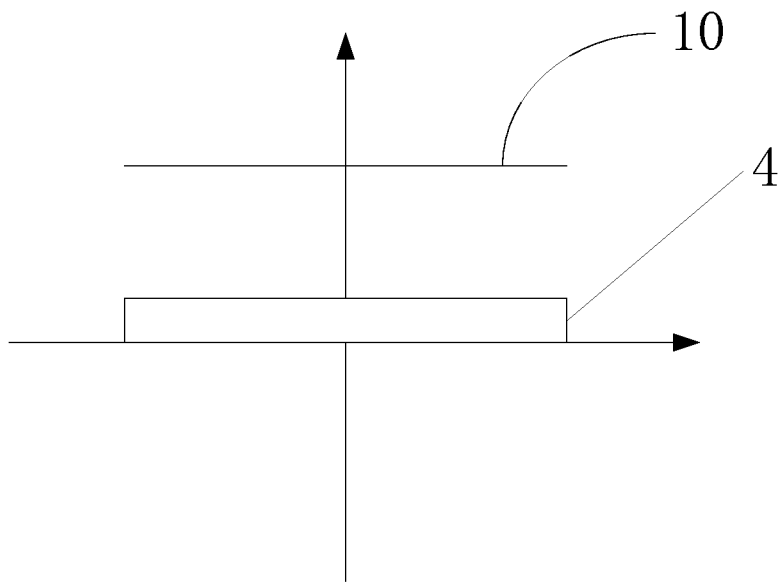
FIG. 3 shows a schematic diagram of an energy state of a glass adhesive during a laser sintering process according to some embodiments of the present disclosure.

To be exemplary, as shown in FIG. 3, a straight line 10 in parallel with the surface of the glass adhesive 4 is used to indicate an energy amount of the glass adhesive 4, i.e., the central region of the glass adhesive 4 receives the same (substantially same) energy as the edge region of the glass adhesive 4 when the glass adhesive 4 is subjected to the laser sintering. Therefore, the heat received by the glass adhesive 4 is distributed uniformly, a heat stress caused by non-uniform heat distribution of the glass adhesive 4 is reduced, and the mechanical strength of the OLED panel is increased.

The first selected value may be set as needed.

Preferably, the thickness the functional layer 3 in a transition area decreases gradually from the first region to the second region, such that the glass adhesive has a uniform intensity of the laser beam irradiated thereon.

In the present embodiment, a difference value between the thickness of the first region and that of the second region may be set to be a second selected value, such that the intensity of the laser beam irradiated on the central region of the glass adhesive is less than that irradiated on the edge region of the glass adhesive 4.

Figure 4:
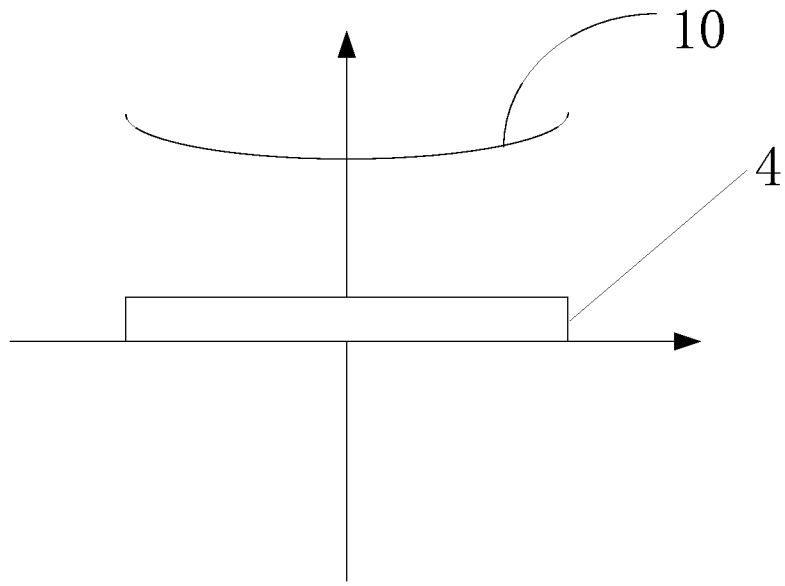
FIG. 4 shows a schematic diagram of an energy state of a glass adhesive during a laser sintering process according to some embodiments of the present disclosure.

To be exemplary, as shown in FIG. 4, a curved line 10 is used to indicate energy amount of the glass adhesive 4, and the height of the position on the curved line corresponding to the central region of the glass adhesive 4 is lower than that of the position corresponding to the edge region of the glass adhesive 4. That is, the distance between the central position of the curved line and the glass adhesive 4 is less than that between any one of two ends of the curved line and the glass adhesive 4, and thus the edge region of the glass adhesive 4 receives more energy than the central region of the glass adhesive 4 during the laser sintering process, thereby effectively sintering the edge of the glass adhesive 4, and avoiding the adverse effects caused by the over sintering of the glass adhesive 4 due to the excessive energy at the central region of the glass adhesive 4, so as to improve the packaging effect of the glass adhesive 4.

The second selected value may be set as needed.

Optionally, the second region may have a non-uniform thickness, for example, decreasing gradually towards the periphery.

In the present embodiment, the functional layer 3 is formed by a plurality of stacked film layers. The multiple film layers enable different regions on the functional layer 3 to have different thicknesses, thereby adjusting the distribution of the energy received by the glass adhesive 4.

In the present embodiment, at least two film layers of the functional layer 3 are made of different materials.

Further, the functional layer 3 is made of a transparent or semi-transparent material.

Further, the functional layer 3 is made of ITO, and has a thickness greater than 500 Å.

The material for making the functional layer 3 mainly acts to reduce the laser intensity. Different materials variously attenuate the light intensity, and different thicknesses also variously attenuate the laser intensity. In the present embodiment, preferably, one film layer of the functional layer 3 is made of an ITO material (but not limited to the ITO material), or the functional layer 3, entirely made of the ITO material with a thickness greater than 500 Å, strongly attenuates the laser intensity, and the attenuation of the intensity is stronger with an increase in thickness.

The present disclosure further provides a display device, including any one of the above-mentioned display panels.

Figure 5:
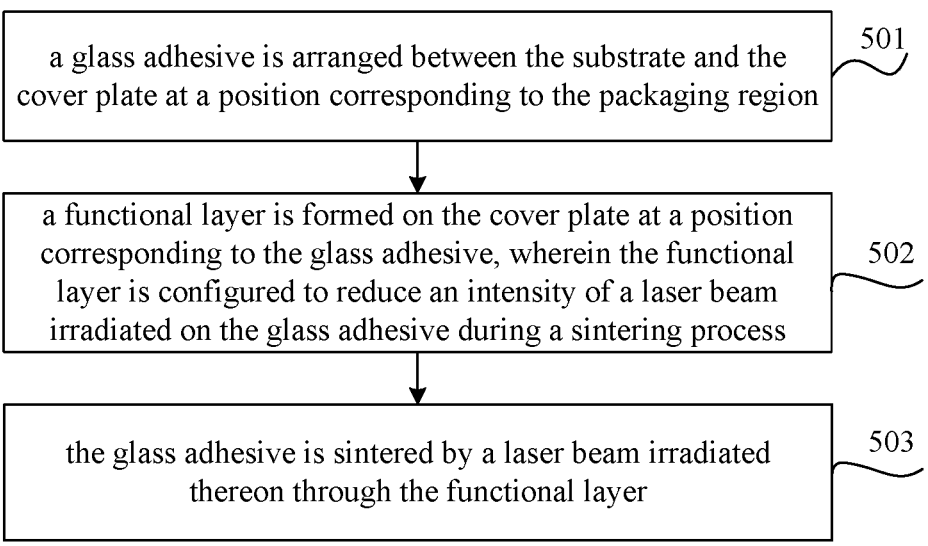
FIG. 5 shows a schematic flow chart of a method for packaging a display panel according to some embodiments of the present disclosure.

The present disclosure further provides a method for packaging the above-mentioned display panel, as shown in FIG. 5, including the following steps.

In step 501, a glass adhesive is arranged between the substrate and the cover plate at a position corresponding to the packaging region.

In step 502, a functional layer is formed on the cover plate at a position corresponding to the glass adhesive, wherein the functional layer is configured to reduce an intensity of a laser beam irradiated on the glass adhesive during a sintering process.

In step 503, the glass adhesive is sintered by a laser beam irradiated thereon through the functional layer.

Further, with the functional layer, a difference between a maximum value and a minimum value of an intensity of the laser beam irradiated on the glass adhesive is not greater than an intensity threshold value. Specifically, the functional layer 3 may reduce the intensity of the laser beam irradiated on the certain region during the sintering process. The difference between the intensity of the laser beam irradiated on the central region and that of the laser beam irradiated on the edge region is not greater than the intensity threshold value.

With the above-mentioned solution, the functional layer effectively prevents the glass adhesive from being over sintered or avoids poor bonding due to poor melting of the glass adhesive, and improves the packaging performance of the glass adhesive. Since the difference between a maximum value and a minimum value of the intensity of the laser beam irradiated on the glass adhesive is not greater than the intensity threshold value, the glass adhesive may be substantially heated uniformly thereinside, and a robustness of the display device is improved.

Optionally, as shown in FIG. 1, the functional layer 3 is formed at the position corresponding to the glass adhesive 4 and on a side of the cover plate 1 away from the substrate 2. The functional layer 3 may reduce the intensity of the laser beam irradiated in the central region of the glass adhesive during the laser sintering process.

The glass adhesive 4 is sintered by the laser beam irradiated thereon from a side of the functional layer 3 away from the cover plate 1.

In the present embodiment, the functional layer 3 is arranged at a side on the cover plate 1 close to the substrate 2. That is, in the case that the functional layer 3 is manufactured between the glass adhesive 4 and the cover plate 1, the functional layer 3 may be sintered and melt together while the glass adhesive 4 is subjected to the laser sintering.

In the present embodiment, the functional layer 3 is arranged at a side of the cover plate 1 away from the substrate 2, the method for packaging the display panel further including: removing the functional layer 3.

The functional layer 3 has a small thickness, and is made of a transparent or semi-transparent material, with the main function of reducing the laser intensity. Therefore, the arrangement of the functional layer 3 does not affect the subsequent manufacturing process of the display panel, nor influence the entire performance of the display panel. In order to simplify the process procedure, the functional layer 3 may be not removed.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A display panel, comprising:
a substrate and a cover plate,
wherein the substrate comprises a display region and a packaging region located at a periphery of the display region, a glass adhesive is arranged between the substrate and the cover plate at a position corresponding to the packaging region, and a functional layer is arranged on the cover plate at a position corresponding to the glass adhesive, and configured to reduce an intensity of a laser beam irradiated on the glass adhesive during a sintering process,
wherein the glass adhesive comprises a central region and an edge region,
wherein the functional layer comprises a first region corresponding to the central region and a second region corresponding to the edge region, and a thickness of the first region is greater than that of the second region.

2. The display panel according to claim 1, wherein the functional layer is further configured to reduce the intensity of the laser beam irradiated on the central region during the sintering process, such that a difference value between the intensity of the laser beam irradiated on the central region and that irradiated on the edge region is not greater than an intensity threshold value.

3. The display panel according to claim 1, wherein a difference value between the thickness of the first region and that of the second region is set to be a first selected value, such that the intensity of the laser beam irradiated on the central region of the glass adhesive is the same as that irradiated on the edge region of the glass adhesive.

4. The display panel according to claim 1, wherein a difference value between the thickness of the first region and that of the second region is set to be a second selected value, such that the intensity of the laser beam irradiated on the central region of the glass adhesive is less than that irradiated on the edge region of the glass adhesive.

5. The display panel according to claim 1, wherein the thickness of the functional layer in a transition region decreases gradually from the first region to the second region, such that the glass adhesive has a uniform intensity of the laser beam irradiated thereon.

6. The display panel according to claim 1, wherein the functional layer is formed by a plurality of stacked film layers.

7. The display panel according to claim 6, wherein at least two film layers of the functional layer are made of different materials.

8. A display device, comprising the display panel according to claim 1.

9. The display panel according to claim 1, wherein the thickness of the functional layer decreases gradually from the center to the periphery.

10. The display panel according to claim 1, wherein the thickness of the functional layer corresponds to the distribution of the intensity of the laser beam output by a laser used in the sintering process, wherein the thickness of the functional layer in a region corresponding to the laser beam output by the laser with a high intensity has a thickness greater than that of the functional layer in a region corresponding to the laser beam output by the laser with a low intensity.

11. The display panel according to claim 1, wherein the functional layer is made of a transparent or semi-transparent material.

12. The display panel according to claim 1, wherein the functional layer is made of indium tin oxide (ITO), and has a thickness greater than 500 Å.

13. The display panel according to claim 1, wherein an area of the functional layer is not less than that of the glass adhesive.

14. The display panel according to claim 1, wherein the functional layer is arranged on a side of the cover plate away from the substrate.

15. The display panel according to claim 1, wherein the functional layer is arranged on a side of the cover plate close to the substrate.

16. A method for packaging a display panel, wherein the display panel comprises a substrate and a cover plate, the substrate comprises a display region and a packaging region at the periphery of the display region, and the method comprises:
arranging a glass adhesive between the substrate and the cover plate at a position corresponding to the packaging region;
forming a functional layer on the cover plate at a position corresponding to the glass adhesive, wherein the functional layer is configured to reduce an intensity of a laser beam irradiated on the glass adhesive during a sintering process; and sintering the glass adhesive by a laser beam irradiated thereon through the functional layer, wherein the glass adhesive comprises a central region and an edge region, and the functional layer is further configured to reduce the intensity of the laser beam irradiated on the central region during the sintering process, wherein the functional layer comprises a first region corresponding to the central region and a second region corresponding to the edge region, and a thickness of the first region is greater than that of the second region.

17. The method according to claim 16, further comprising:

removing the functional layer.

18. The method according to claim 16, wherein the forming a functional layer on the cover plate at a position corresponding to the glass adhesive comprises:

forming the functional layer at the position corresponding to the glass adhesive and on a side of the cover plate away from the substrate; and the sintering the glass adhesive by a laser beam irradiated thereon comprises:

sintering the glass adhesive by the laser beam irradiated thereon from a side of the functional layer away from the cover plate.

19. A display panel, comprising:

a substrate and a cover plate, wherein the substrate comprises a display region and a packaging region located at a periphery of the display region, a glass adhesive is arranged between the substrate and the cover plate at a position corresponding to the packaging region, and a functional layer is arranged on the cover plate at a position corresponding to the glass adhesive, and configured to reduce an intensity of a laser beam irradiated on the glass adhesive during a sintering process, wherein the thickness of the functional layer decreases gradually from the center to the periphery.

20. The display panel according to claim 19, wherein the functional layer comprises a first region corresponding to the central region and a second region corresponding to the edge region, and a thickness of the first region is greater than that of the second region.

* * * * *